United States Patent [19]

Mohsen

[11] Patent Number: 5,400,262
[45] Date of Patent: Mar. 21, 1995

[54] UNIVERSAL INTERCONNECT MATRIX ARRAY

[75] Inventor: Amr M. Mohsen, Saratoga, Calif.

[73] Assignee: Aptix Corporation, San Jose, Calif.

[21] Appl. No.: 173,729

[22] Filed: Dec. 27, 1993

Related U.S. Application Data

[63] Continuation of Ser. No. 764,263, Sep. 23, 1991, abandoned, which is a continuation-in-part of Ser. No. 410,194, Sep. 20, 1989.

[51] Int. Cl.$^6$ .......................................... H03K 17/693
[52] U.S. Cl. .................................... 364/489; 364/488; 326/41; 326/44
[58] Field of Search ...................... 364/488, 489, 490; 307/465.1

[56] References Cited

U.S. PATENT DOCUMENTS

| | | | |
|---|---|---|---|
| 4,124,899 | 11/1978 | Birkner et al. | 307/465 |
| 4,245,273 | 1/1981 | Feinberg | 361/714 |
| 4,327,355 | 4/1982 | Gente et al. | 340/825.9 |
| 4,433,331 | 2/1984 | Kollaritsch | 340/825.83 |
| 4,458,297 | 7/1984 | Stopper et al. | 361/403 |
| 4,467,400 | 8/1984 | Stopper | 361/767 |
| 4,479,088 | 10/1984 | Stopper | 324/525 |
| 4,631,686 | 12/1986 | Ikawa et al. | 364/490 |
| 4,649,413 | 3/1987 | Kelly | 257/210 |
| 4,703,436 | 10/1987 | Varshney | 364/490 |
| 4,706,216 | 11/1987 | Carter | 365/94 |
| 4,717,988 | 1/1988 | Landis | 361/767 |
| 4,727,268 | 2/1988 | Hori | 307/465 |
| 4,758,745 | 7/1988 | El Gamal et al. | 307/465 |
| 4,779,340 | 10/1988 | Kihm et al. | 29/847 |
| 4,786,904 | 11/1988 | Graham, III et al. | 340/825.83 |
| 4,813,017 | 3/1989 | Wong | 365/156 |
| 4,840,924 | 6/1989 | Kinbara | 437/189 |
| 4,847,732 | 7/1989 | Stopper et al. | 361/739 |
| 4,860,165 | 8/1989 | Cassinelli | 361/710 |
| 4,866,432 | 9/1989 | Goetting | 340/825.84 |
| 4,870,302 | 9/1989 | Freeman | 307/465 |
| 4,949,084 | 8/1990 | Schwartz et al. | 340/825.83 |
| 5,015,885 | 5/1991 | El Gamal et al. | 307/465 |
| 5,036,473 | 7/1991 | Butts et al. | 364/489 |
| 5,107,146 | 4/1992 | El-Ayat | 307/465 |
| 5,109,353 | 4/1992 | Sample et al. | 364/578 |
| 5,255,203 | 10/1993 | Agrawal et al. | 364/489 |

FOREIGN PATENT DOCUMENTS

| | | |
|---|---|---|
| 177261A2 | 4/1986 | European Pat. Off. . |
| 204034A2 | 12/1986 | European Pat. Off. . |
| 310357A3 | 4/1989 | European Pat. Off. . |
| 329018A3 | 8/1989 | European Pat. Off. . |
| 59-161839 | 9/1984 | Japan . |
| WO85/03804 | 8/1985 | WIPO . |

OTHER PUBLICATIONS

Swager, "Crosspoint-switch IC's Enter Digital Domain", *EDN*, 16 Feb. 1989, pp. 76–86.
Quinnell, "Digital Switches Provide Bus Connections with No Additional Gate Delays", *EDN*, 18 Jul. 1991, p. 64.

(List continued on next page.)

*Primary Examiner*—Vincent N. Trans
*Attorney, Agent, or Firm*—Skjerven, Morrill, MacPherson, Franklin & Friel

[57] ABSTRACT

A universal interconnect matrix area array or crosspoint switch is comprised of a first set of conductive leads formed in a first direction, a second set of conductive leads formed in a second direction, the second direction being not parallel to the first direction, and structure for electrically interconnecting selected ones of the conductive leads in the first set of conductive leads to one or more of the conductive leads in the second set of conductive leads. Input/output pads are arranged in an area matrix and connected to selected ones of the first set of conductive leads and the second set of conductive leads. Selected ones of the conductive leads are segmented thereby to allow any input/output pad to be connected to one or more of the other input-/output pads without removing from use any input/output pads not intended to be so connected. At least one of the input/output pads is internal to the input/output pads along the periphery of the area matrix.

6 Claims, 7 Drawing Sheets

OTHER PUBLICATIONS

"16 × 16 Crosspoint Switch Array", E.E. Products News, pp. 1–4.

"Fast Digital Switches Route Bus Signals", E.E. Product News.

"Gallium Arsenide 64 × 64 Crosspoint Switch", Preliminary Data Sheet, Vitesse Semiconductor Corporation, Feb. 1991, pp. 1–10.

Barber et al, "A 64 × 17 Non-Blocking Cross Point Switch", IEEE Int'l. Solid-State Circ. Conf., 1988, pp. 1–3.

Colbry et al, "High Performance Crosspoint Switch Implemented in CMOS on AVP", IEEE Int'l. Solid-State Circ. Conf., 1987, pp. 2–5.

Donnell, "Crosspoint Switch:A PID Approach," *Digital Design*, Jul. 1986, pp. 40–42, 44.

"Logically Controlled Chip Interconnection Technique," *IBM Tech. Discl. Bull.*, Aug. 1989, vol. 32, No. 3B, pp. 294–299.

Hyden et al, "Silicon Circuit Boards: Off-the-Shelf Convenience," *Elect. Pack. & Prod.*, Apr. 1988, pp. 70–74.

Anne Watson Swager, "Crosspoint-switch ICs Enter Digital Domain", *Technology Update, EDN*, pp. 76–86, Feb. 16, 1989.

Richard A. Quinnell, "Digital Switches Provide Bus Connections with No Additional Gate Delays", *Product Update, EDN*, p. 64, Jul. 18, 1991.

Jim Donnell, Intel Corp., "Crosspoint Switch: A PLD Approach", *Digital Design*, pp. 40–41 and p. 44, Jul. 1986.

"16 × 16 Crosspoint Switch Array", *Analog Devices*, AD75019, pp. 1–4.

"Fast Digital Switches Route Bus Signals", *Circle EEPN Reader Service No. 18*.

"Gallium Arsenide 64×64 Crosspoint Switch", *Vitesse Semiconductor Corporation; Preliminary Data Sheet*, pp. 1–10, Feb., 1991.

Frank E. Barber, Wayne E. Werner, Paul A. Wilford, Thomas R. Wik and Ronald J. Wozniak, "TAM 9.7 A 64 × 17 Non-Blocking Cross Point Switch", *AT&T Bell Laboratories*, Speaker, Frank E. Barber.

B. W. Colbry, M. F. Jukl, J. P. Savicki, D. C. Schmidt, and N. A. Teneketges, "High Performance Crosspoint Switch Implemented in CMOS on AVP", *AT&T Bell Laboratories*.

*Electronic Packaging & Production*, "Silicon Circuit Boards: Off-the Shelf Convenience", L. Hyden et al, Apr. 1988, pp. 70–74.

Hantusch, "A Programmable Interconnection Module", *IEE Colloquim Dig.*, Colloquim on IC Design—Gate Arrays, 21 Nov, 1984, pp. 8.1–8.4.

Wooley et al, "Active Substrate System Integration", *IEEE*, Jul. 1987, pp. 468–471.

Bogdan, "An Electrically Programmable Silicon Circuit Board", pp. 472–476.

IBM TDB, "Logically Controlled Chip Interconnection Technique", vol. 32, No. 3B, Aug. 1989, pp. 294–299.

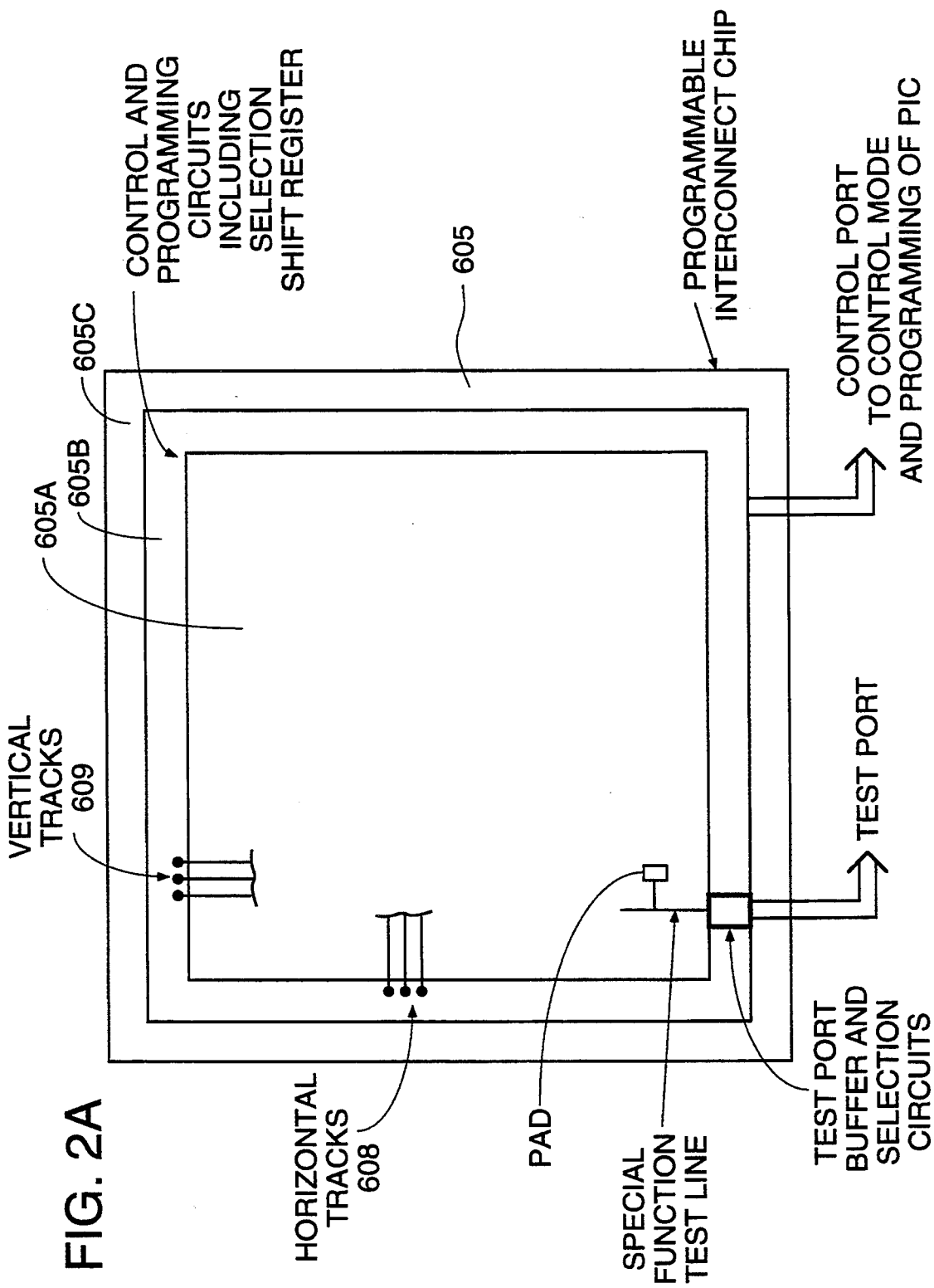

UNIVERSAL INTERCONNECT MATRIX ARRAY

CROSS REFERENCE TO RELATED APPLICATIONS

This is a continuation of U.S. patent application Ser. No. 07/764,263, filed 23 Sep. 1991, now abandoned, which is a continuation-in-part of U.S. patent application Ser. No. 07/410,194, filed 20 Sep. 1989, now allowed.

FIELD OF THE INVENTION

This invention relates to a universal interconnect matrix array suitable for programmably interconnecting circuit components and terminals. More particularly, this invention relates to a crosspoint switch containing programmable elements, such as antifuses or transistor switches, which allow one or more selected input or output pads of the switch to be connected to one or more of any other input or output pads of the switch.

BACKGROUND OF THE INVENTION

Crosspoint switches are well known. An article by Watson, published in EDN, Feb. 16, 1989, pages 76–86, entitled "Crosspoint-Switch IC's Enter Digital Domain" describes the crosspoint switch art and the development of digital crosspoint switches. As stated in this article, programmable crosspoint switches connect one of many input leads (also called "pads" or "terminals") to one or more output leads. While initially crosspoint integrated circuit switches were developed to replace electro-mechanical switches such as relays in electrical telephone-switching systems, crosspoint switches are now used in parallel-processing, industrial-control-routing and data-communications systems. Crosspoint switches are of two types: analog and digital. An analog crosspoint switch is nothing more than a bi-directional transmission path which passes a selected signal substantially unchanged from an input terminal to an output terminal. A digital crosspoint switch, however, is a system which will take a digital signal on one input terminal and provide a replica of that digital signal on one or more output terminals.

As disclosed in the above-cited article, all analog crosspoint switches have a number of basic elements: the switch array, an address decoder and a control memory or latches. For any N×M crosspoint switch, N equals the number of input terminals, M equals the number of output terminals, and the integrated circuit consists of NM distinct switches. A typical prior art analog switch (i.e., a switch which transmits passively a signal on one input or output pad to another one or more input or output pads) is a relatively inefficient device in connecting one input pad to a second input pad or one output pad to another output pad. As shown in FIG. 2 in the above-cited article, to connect, for example, the input pad X0 to the input pad X1, control signals must be applied to analog switch 0 and analog switch 1 to connect input pad X0 through analog switch 0 to the output pad Y0 and then connect the output pad Y0 through analog switch 1 to input pad X1. Accordingly, output pad Y0 is lost for other purposes. This inefficiency greatly restricts the usefulness of the analog switch of the type shown in FIG. 2.

U.S. Pat. No. 4,949,084 also discloses in FIG. 1 a cross point circuit wherein each of the input pads in circuit "A" can be connected to one or more of the output pads in circuit "B". However, should an input pad in circuit A be desired to be connected to one or more other input pads in circuit A then an output pad must be dedicated to this function.

The above crosspoint switches use decoding elements and/or multiplexers to form the desired connections. As the number of input terminals and output terminals increase, the complexity of these switches goes up extremely rapidly. Accordingly, these crosspoint switches are limited to a relatively small number of input terminals and output terminals. The total number of input and output terminals for these prior art crosspoint switches typically ranges from 8 to 128.

SUMMARY OF INVENTION

In accordance with this invention, a crosspoint switch of unique configuration is provided which enables any one or more input or output pads on the switch to be connected to one or more of the remaining input or output pads on the switch without requiring the dedication of an additional input or output pad to this function. The programmable cross point switch of this invention is suitable for use in a variety of applications such as computers (including parallel processors), industrial control systems, switching networks and programmable circuits, whether formed, for example, on printed circuit boards, insulating substrates or as an integrated circuit.

In further accordance with this invention, the crosspoint switch (also called a "programmable interconnect chip" or a "universal interconnect matrix array") is provided with horizontal and vertical conductive segments, programmable elements for interconnecting the horizontal and vertical conductive segments at any one or more of the plurality of intersections of said segments and conductive pads for connecting to circuitry external to the crosspoint switch.

As a feature of this invention, the connection between selected pads is formed using horizontal and/or vertical conductive segments contrary to the prior art where decoders and multiplexers are used for this purpose. By use of one or more conductive tracks, each track being capable of being broken into segments, in a channel associated with each row and column of input/output pads (i.e.; by use of routing architecture to interconnect the selected pads), the complexity of the crosspoint switch is substantially reduced while the flexibility of the crosspoint switch is substantially increased.

As an additional feature of this invention, the programmable element in the crosspoint switch can be one time programmable antifuses and/or fuses or, alternatively, transistor switches capable of being reprogrammed as required either during or between operation of the circuitry of which the crosspoint switch is a part, should it be desired to reconfigure the circuitry interconnected by the crosspoint switch of this invention.

This invention will be more fully understood in view of the following detailed description of selected embodiments thereof taken together with the following drawings.

BRIEF DESCRIPTION OF THE DRAWINGS

FIG. 2a illustrates the architecture of one embodiment of the crosspoint switch of this invention formed on a single integrated circuit;

DETAILED DESCRIPTION

The universal interconnect matrix array of this invention will be described in conjunction with two embodiments. Other embodiments will be apparent to those skilled in the art in view of the following description. The following description is meant to be illustrative only and not limiting.

Figure 3:
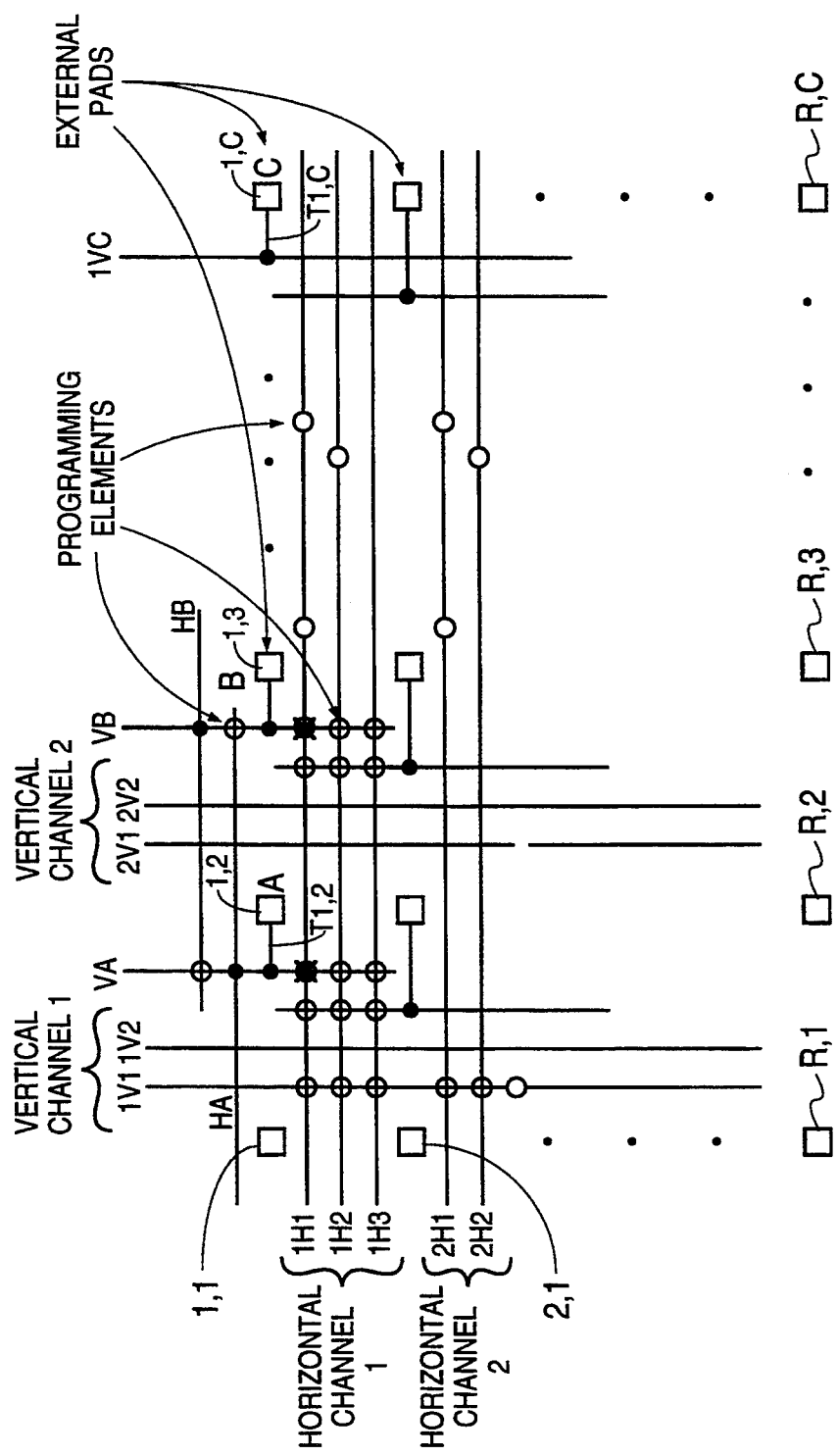
FIG. 3 illustrates another embodiment of the crosspoint switch of this invention in one embodiment.

FIG. 3 illustrates one embodiment of this invention. As shown in FIG. 3, the crosspoint switch of this invention, as formed on an integrated circuit chip, contains a plurality of conductive pads (1,1) (1,2) through (R,C) where R represents the maximum number of rows of pads and C represents the maximum number of columns of pads. These conductive pads are connected by conductive traces, such as conductive trace T1,2 interconnecting pad 1,2 to vertical conductive segment VA. As shown in FIG. 3, a plurality of horizontal conductive segments 1H1, 1H2, 1H3, 2H1, 2H2, for example, run horizontally across the surface of the chip. These horizontal conductive segments are insulated from and intersected by a multiplicity of vertical conductive segments 1V1, 1V2 ... 1VC. Programmable elements, such as antifuses, fuses or programmable transistors, are depicted at the intersection of each vertical and horizontal conductive segment by circles. A circle with an "X" in it indicates a programmed interconnection between the overlying vertical lead and the underlying horizontal lead. An empty circle indicates an unprogrammed element.

The pads (1,1) through (R,C) are intended to be connected to external circuitry. For example, pad (1,2) is connected to either horizontal segment HA or vertical segment VA or both. These segments allow pad (1,2) (and other pads capable of being connected to these segments) to be connected to any of the other routing tracks in the array. Similarly, pad 1,3 can be connected by conductive traces to conductive segments HB and VB, for example.

The conductive segments between the rows of pads comprise horizontal channels. While in accordance with this invention one horizontal channel is associated with each row of pads and one vertical channel is associated with each column of pads, each channel generally contains a plurality of conductive tracks.

The horizontal conductive tracks, for example, horizontal conductive tracks 1H1, 1H2 and 1H3, between the first and second rows of pads, typically contain segmented tracks. That is, at least one of these tracks is broken into two or more conductive segments. The number of horizontal tracks in each horizontal channel can be set at any appropriate number "h".

Similarly, the vertical tracks are grouped in channels with each channel consisting of the tracks between two columns of conductive pads. Thus, as shown, one vertical channel consists of vertical conductive segments 1V1, 1V2 and VA. The second vertical channel consists of vertical conductive tracks 2V1, 2V2 and VB, for example. At least one of the vertical tracks in each vertical channel is also broken into two or more conductive segments. The number of vertical tracks in each vertical channel is represented as "v" for example.

The use of a plurality of segmented tracks in a given channel allows two or more conductive pads to be interconnected without requiring the dedication of an additional output pad to implement the interconnection and uses only a segment of the track.

The programming elements are designated by the open circles at the intersection of the horizontal and vertical segments.

For a square array of conductive pads 1,1 ... R,C, the number of horizontal conductive tracks in each horizontal channel equals the number of vertical conductive tracks in each vertical channel. The total number of programming elements is proportional to the number of horizontal channels $N_H$ times the number of vertical channels $N_V$ times the number "h" of conductive tracks in each horizontal channel times the number "v" of conductive tracks in each vertical channel. Therefore the number of programming elements Q is given by the following equation:

$$Q \propto hv N_H N_V$$

The total number Y of output pins from the chip is given by:

$$Y = N_H N_V$$

The number of programming elements (and hence the area of the array) is then linearly related to the number of pins from the package as follows.

$$Q \propto hvY$$

The programming elements can be one time programmable antifuses and/or fuses, or reprogrammable transistor switches. As described below, memory cells such as RAM cells can be used to control the setting of the switches.

The lengths and numbers of the horizontal and vertical conductive segments are optimized to provide the best statistical coverage of the random connections required between the pads (1,1) through (R,C) to implement specific circuits. The segmented tracks as described above provide more efficient utilization of the tracks. The numbers h and v representing, respectively, the number of horizontal conductive tracks in a horizontal channel and the number of vertical conductive tracks in a vertical channel, depend weakly on the number of horizontal channels $N_H$ and the number of vertical channels $N_V$.

Note that each conductive pad, such as pad 1,1 can be connected to any one of the other pads in the array by programming one or more programmable elements.

Figure 4A:
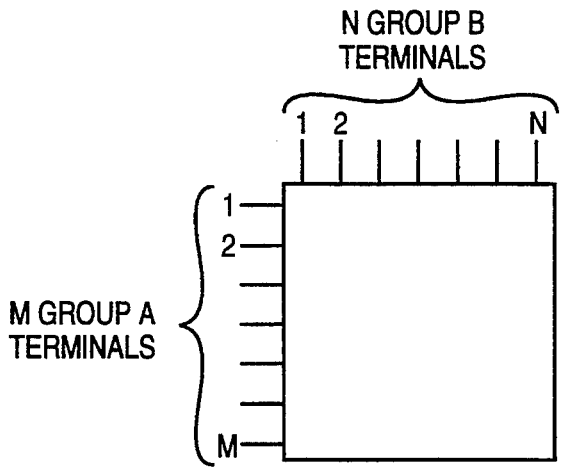
FIGS. 4a and 4b illustrate a prior art crosspoint switch wherein the programmable elements increase as a quadratic function of the total number of input pads and output pads to be interconnected.
Figure 4B:
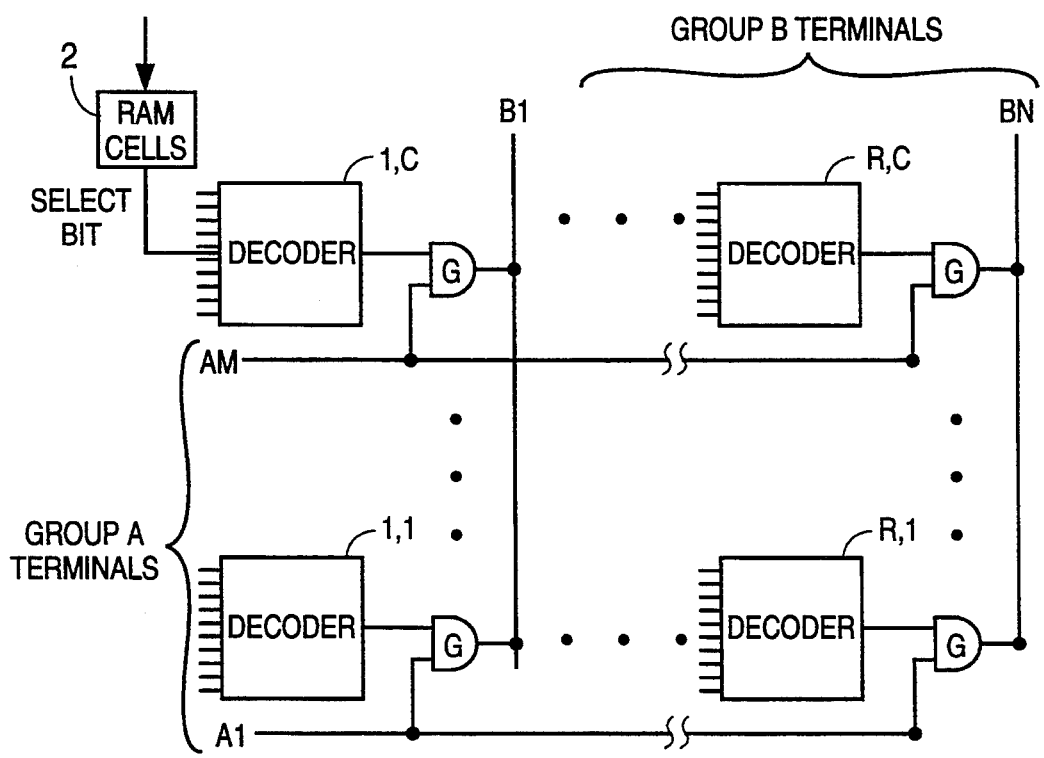

In one prior art approach for implementing cross point switches which employ a hierarchy of decoders and multiplexers connecting one of a group of conductive pads to any one of another group of conductive pads, the decoders require selection bits stored in RAM cells to implement the connection of any one of the group A terminals to any one of the group B terminals (See FIG. 4). Thus as shown in FIGS. 4a and 4b, decoder 1,C is configured by bits stored in RAM cell 2. Similarly decoder 1,1 is also configured by bits stored in a RAM cell as are decoders R,1 and R,C. Accordingly, to connect, for example, input pad A1 in the group A terminals to pad B1 in the group B terminals, decoder 1,C must produce a high output signal thereby to gate the signal on terminal A1 to terminal B1 through gate G. All other decoders will have a low input signal, thereby preventing these decoders from enabling the gates to which the output signals from these decoders are transmitted.

Figure 5:
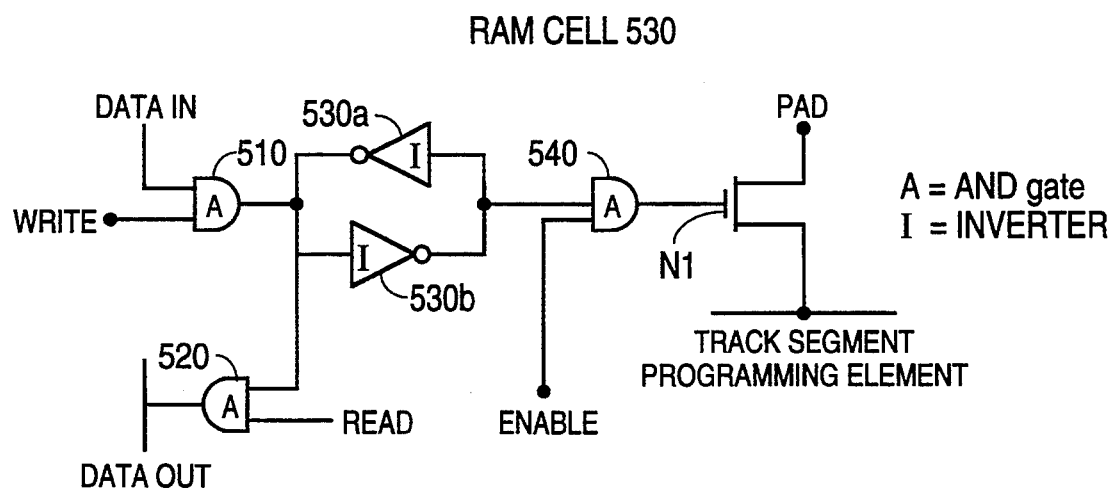
FIGS. 5 and 6 illustrate the logic block diagram and circuit diagram respectively for the transistor programming elements used to interconnect a vertical and a horizontal conductive segment or two intersecting conductive segments in accordance with this invention.

While to provide an analog connection (i.e., a connection in which the signal on the input terminal A1, for example, can be passed directly through to the output terminal B1, for example) each gate G shown in FIG. 4 can be a simple transistor switch (such as transistor N1 shown, for example, in FIG. 5). The gate can also provide a digital connection using equivalent input buffers for A terminals and output buffers for B terminals.

The number of transistors/circuits required to implement the decoding architecture shown in FIG. 4 is proportional to the number of input pads multiplied by the number of output pads. If there are M group A terminals and N group B terminals, the total number of terminals is N+M and the number of transistor circuits T required to implement this decoding structure is:

$$T \propto MN[k+l(\ln M+\ln N)]$$

Here, k represents the number of transistors/circuits used in the gates G, l represents the number of transistors/circuits of the RAM cells and the decoders. Thus if N equals M, the total number of transistors required to implement this scheme is:

$$T \propto N^2[k+2l\ln N]$$

This structure has the following disadvantages:

1. The terminals in group A cannot be connected to each other. Similarly, the terminals in group B cannot be connected to each other. Only connections between one or more terminals in group A and one or more terminals in group B are possible.

2. The number of transistors/circuits increases almost quadradically with the number of pins to be connected. Therefore the architecture is limited to a small number of pins such as 64 input pins and 64 output pins, for a total of 128 pins or some lesser number. A larger number of pins would require a very large increase in the array area and the chip area.

Figure 1A:
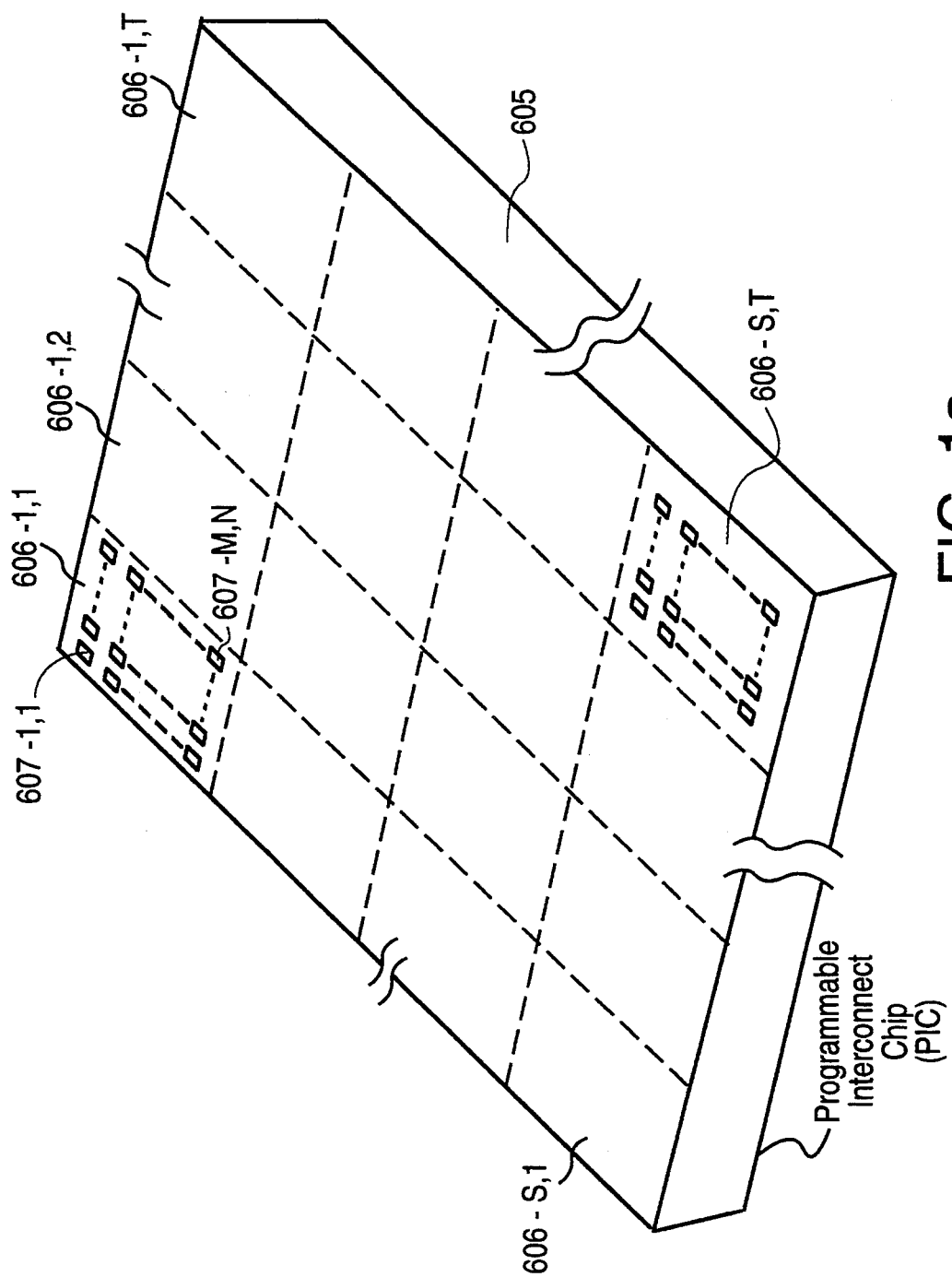
FIGS. 1a and 1b illustrate one embodiment of the crosspoint switch of this invention.
Figure 1B:
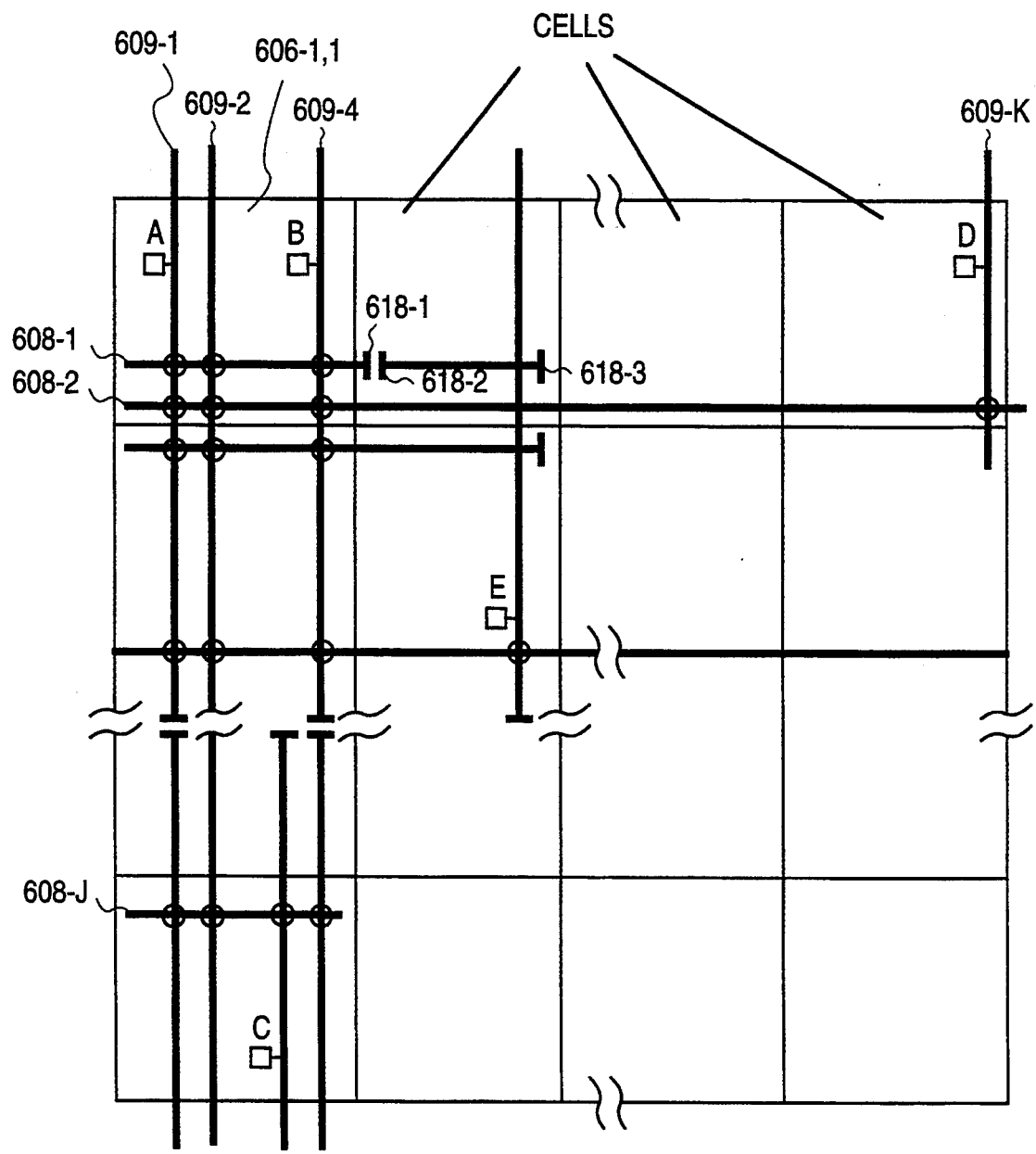

FIGS. 1a and 1b illustrate a crosspoint switch formed on an integrated circuit chip 605 in accordance with this invention. In FIG. 1a chip 605 contains a plurality of cells 606-1,1 through 606-S,T where S represents the number of rows of cells in the chip 605 and T represents the number of columns of cells in chip 605. Each cell has an array of electrically conductive pads 607-1,1 through 607-M,N where M represents the number of rows of pads in the cell and N represents the number of columns of pads in the cell. Since each cell is identical in configuration, only the conductive pads 607 associated with cell 606-1,1 will be described in detail with the understanding that the conductive pads associated with each of the other cells 606-s,t (where s is an integer given by $1 \leq s \leq S$ and t is an integer given by $1 \leq t \leq T$) in chip 605 function identically.

FIG. 1b illustrates the configuration of cell 606-1,1 and also of each of the other cells 606-s,t in FIG. 1a. In FIG. 1b horizontal conductive tracks 608-1 through 608-J (where J is an integer representing the maximum number of horizontal conductive tracks formed on chip 605) are shown. In addition, vertical conductive tracks 609-1 through 609-K are shown (where K is an integer representing the maximum number of columns of conductive tracks formed on chip 605). The horizontal conductive tracks 608-1 through 608-J are formed on one level of interconnections on chip 605 while the vertical conductive tracks 609-1 through 609-K are formed on a second level of interconnections on chip 605. Typically, these interconnections are formed in a manner well known in the semiconductor processing arts and thus the method of forming these interconnections will not be discussed. The horizontal conductive leads 608-1 through 608-J have differing lengths across the chip. The cell 606-1,1 shown in the upper left hand corner of both FIG. 1a and FIG. 1b has a plurality of horizontal conductive leads 608 originating in and extending from cell 606-1,1 to each of the other cells 606-1,2 through 606-1,T in the same row. Likewise, cell 606-1,1 has a plurality of vertical conductive leads 609 extending from cell 606-1,1 to each of the other cells 606-2,1 to 606-S,1 in the same vertical column.

The horizontal and vertical traces 608 and 609 have at each of their intersections a programmable connective structure (i.e., programmable elements) such as, for example, an antifuse and/or a fuse, or a programmable and reprogrammable transistor. Typically, an antifuse comprises a capacitive structure with a dielectric capable of being broken down by the application of a selected voltage to provide a conductive path between the two plates of the capacitor. Antifuses are well known in the art and thus will not be described in detail. The substrate of the chip 605 may have in it selected circuitry to enable the programming of the programmable elements at selected intersections in accordance with design requirements.

As shown in FIG. 1b, vertical leads 609-1 through 609-K are formed on the programmable interconnect chip 605 so as to extend at a minimum across one cell 606 and at a maximum across all cells. Thus a plurality of vertical leads 609 cross each cell with the length of leads varying from being such as to extend across just that cell to being such as to extend across all cells in a column.

Horizontal conductive leads 608-1 through 608-J likewise extend across the chip 605. Again, the horizontal leads 608 extending across one cell vary from a length such that they extend across only that one cell up to a length which will extend across all cells. In FIG. 1b, breaklines are included to indicate that the semiconductor chip 605 is only partially shown with interior portions of the chip having been removed for clarity. However, some conductive leads break not because of the breaklines showing removal of semiconductor material but rather because the conductive leads are intended to stop at a given point. Small lines 618-1, 618-2 and 618-3 are drawn at the terminal points of a conductive lead perpendicular to that lead to indicate that the conductive lead terminates at those points. A horizontal conductive lead thus might comprise one conductive segment extending across the whole chip 605 or a plurality of conductive segments extending across a section of the chip. Similarly, the vertical conductive leads likewise vary from one conductive lead which will extend across the entire height of the chip or two or more conductive segments each extending across a selected portion of the chip.

The particular configuration of the conductive leads extending across one cell and from that cell to adjacent cells depends upon an analysis of the electrical functions to be carried out by the programmable interconnect matrix array and is selected using the most probable types of system requirements to be imposed on programmable interconnect chip 605. This selection depends upon an analysis of the circuit functions to be performed by the circuit using the crosspoint switch of this invention and thus the actual configuration of the crosspoint switch is determined in light of the proposed uses.

To interconnect a given lead corresponding for example to the lead 609-1 connected to pad A in cell 606-1,1 to a given lead corresponding to a different pad either in cell 606-1,1 or in some different cell using the structure shown in FIG. 1$b$, an interconnection between the appropriate vertical conductor 609 and the appropriate horizontal conductor 608 is formed. For example, to connect pad A to pad B (both in cell 606-1,1) the intersection of vertical lead 609-1 and horizontal lead 608-1 is programmed. In the case antifuses are used as the programmable elements a high voltage is applied to this intersection in the circuit so as to break down the dielectric between these two points and form a conductive path therebetween. In addition, the intersection of vertical conductor 609-4 and horizontal conductor 608-1 is also subjected to a high voltage to break down the insulation between these two leads to form an additional conductive path between these two leads. Thus, pad A is connected to pad B by conductors 609-1, 608-1 and 609-4. Should it be desired to connect pad A to any other lead or pad then pad, B will also be connected to that other lead or pad. However, such a connection must be compatible with the circuit in order to be made.

FIG. 1$b$ also illustrates the particular connections which must be formed to connect pad A to pad D, pad A to pad C, or pad A to pad E. Should all of these connections be made then pads B, D, C and E will also be connected to each other through pad A.

Figure 2B:
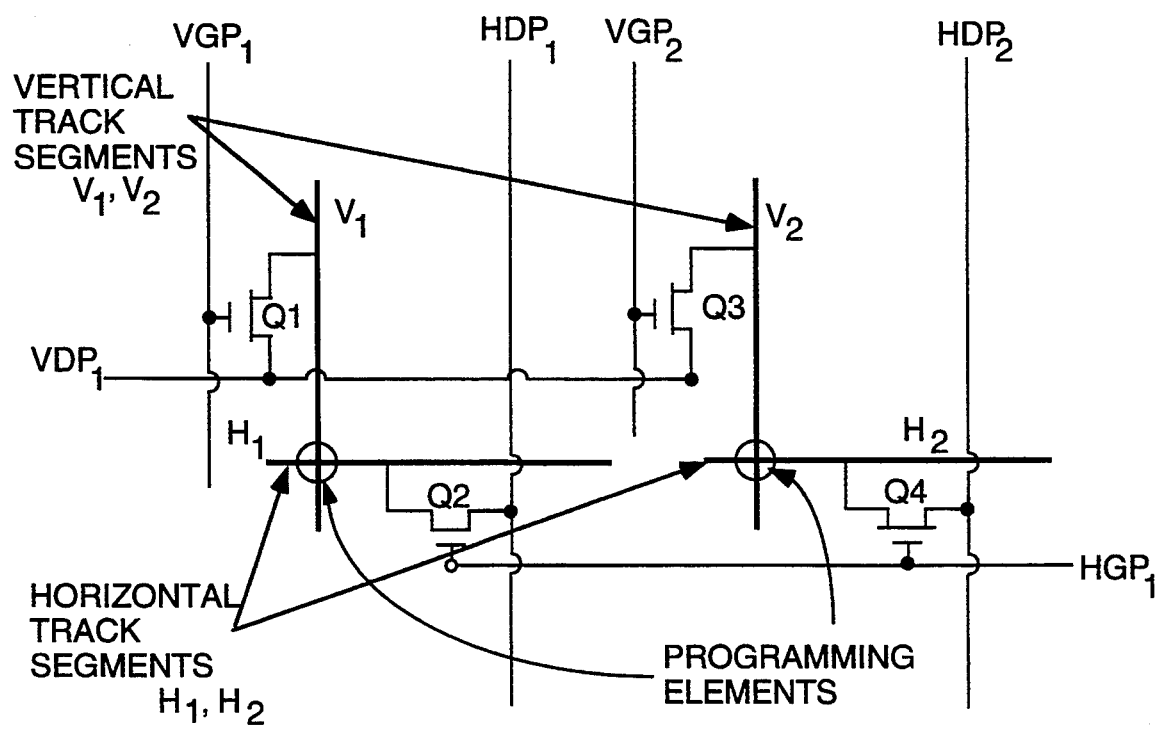
FIG. 2b illustrates one structure for programming the one-time programming element at the intersection of two conductive leads formed on the crosspoint switch of this invention.

FIG. 2$a$ shows in block diagram form one architecture of the crosspoint switch 605 of this invention. The interior 605A of chip 605 contains the cells 606 (as described in conjunction with FIGS. 1$a$ and 1$b$) and the horizontal and vertical tracks 608 and 609 respectively. In peripheral area 605B which forms an annular square around interior 605A are placed control and programming circuits including shift registers for selecting particular horizontal and vertical tracks the intersections of which are to be programmed. In addition, buffer circuitry for the test port bus and the control port bus is provided in this region of chip 605. Annular region 605C surrounds annular region 605B and contains additional circuitry essential to the operation of the chip such as mode selection circuitry which will determine whether the programmable interconnect chip is in the test mode, the operating mode or the programming mode. Additional special circuitry as required will also be placed in peripheral region 605C.

FIG. 2$b$ illustrates a programming structure, in the case antifuses are used as the programmable elements, and particularly programming transistors and circuits to select the intersection to be programmed of horizontal and vertical conductive leads on the chip using only two transistors in the programming circuit path. Utilization of the structure shown in FIG. 2$b$ allows the programming current to reach into the hundreds of milliamps to amperes range necessary to break down the dielectric between the vertical and horizontal conductive leads to form an interconnection therebetween with sufficiently low resistance. For example, to program the intersection of vertical conductive track $V_1$ and horizontal conductive track $H_1$, transistors Q1 and Q2 are provided. Transistor Q1 has its gate connected to voltage source $VGP_1$ and transistor Q2 has its gate connected to a voltage source $HGP_1$. The source of transistor Q1 is connected to vertical conductive track V1 while the drain of transistor Q1 is connected to conductive lead $VDP_1$. The source of transistor Q2 is connected to horizontal lead $H_1$ and the drain of transistor Q2 is connected to conductive lead $HDP_1$. To program the intersection of vertical lead $V_1$ and horizontal lead $H_1$, $VGP_1$ is applied to take the gate of Q1 to a high voltage $V_{GH}$, the gates of other transistors in the array such as transistor Q3 are held at zero volts and the drain voltage VDP1 on transistor Q1 is taken to $V_{PP}$. However, the gate voltage of Q4 is taken high because $HGP_1$ is taken to a high voltage to turn on transistor Q2. The voltage on the drain of Q2 is taken to zero volts by driving $HDP_1$ to zero and HDP2 applied to the drain of Q4 is taken to zero or to $V_{PP}/2$ (which voltage is selected so as not to program the programming element at the intersection of $V_2$ and $H_2$). $V_{PP}$, the programming voltage, is typically 15 to 100 volts. $V_{GH}$, which is applied to lead $VGP_1$, is larger than $V_{PP}$ by the transistor threshold voltage and thus is approximately 18 to 103 volts. Because the devices Q1 to Q4 operate under high voltage, the threshold voltage of these transistors is made approximately three (3) volts. As a result of the above-described voltages, only the programming element at the intersection of conductive lead segments H1 and V1 will receive the full programming voltage $V_{pp}$ and break down.

The programming element used with this invention can be an antifuse and/or a fuse, or a programmable transistor. When the programming element is a transistor (which is used as a switch) the state of this transistor is stored in memory such as, for example, a static RAM cell. In FIG. 5, the RAM cell comprising cross-coupled inverters 530A and 530B is programmed to be in a high or low state by data in transmitted through AND gate 510 enabled by write signal going high. The state of the RAM cell can be read through AND gate 520 by applying a high level read signal to the read input of AND gate 520. The output signal from AND gate 510 is connected to one node of the RAM cell 530 while one input lead of AND gate 520 is also connected to this same node. The other node of RAM cell 530 is connected to one input lead of AND gate 540, the other input lead to which is connected an enable signal. When the enable signal goes high, AND gate 540 will pass the state of RAM cell 530 to the gate of programming element comprising NMOS transistor N1. If the output signal from AND gate 540 is high, transistor N1 turns on and provides a conductive path from the pad to the track segment. If the output signal of AND gate 540 is low, transistor N1 remains off, thereby providing an open circuit between the pad and the track segment.

Figure 6:
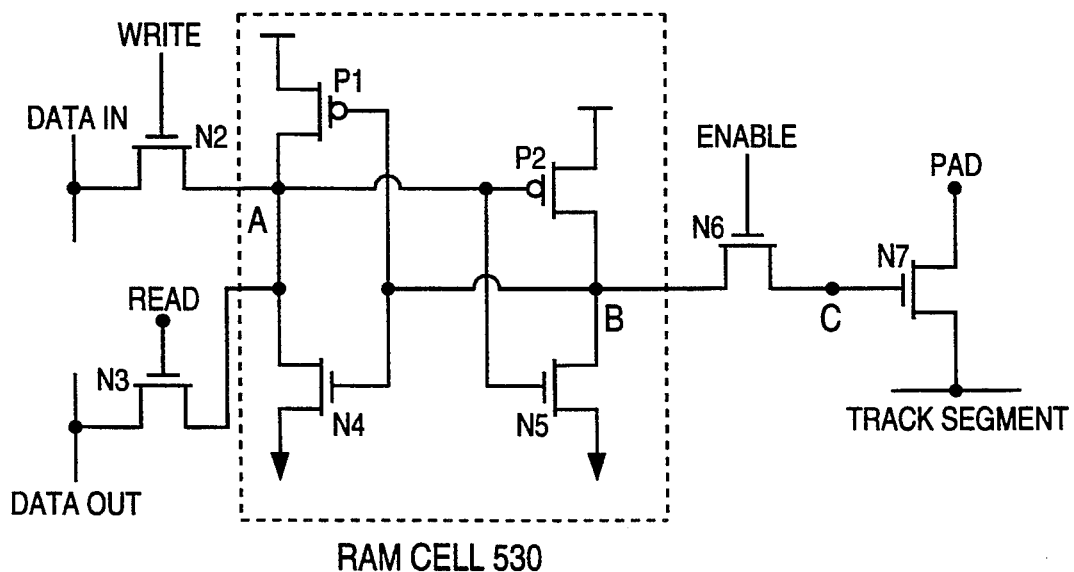

FIG. 6 illustrates the specific circuitry of the structure shown in logic block diagram form in FIG. 5. In FIG. 6 AND gate 510 of FIG. 5 is shown as N-type pass transistor N2 with a write enable signal applied to the gate of transistor N2. When transistor N2 is enabled, a signal data in is passed through transistor N2 to node A of RAM cell 530. RAM cell 530 consists of P-type transistor P1, the drain of which is connected to a power supply and the source of which is connected to the drain of N-type transistor N4. The source of N4 is connected to a reference voltage, shown as ground. The gates of transistors P1 and N4 are connected together and also connected to the node B connected to the drain of P-type transistor P2 and the drain of N-type transistor N5. The RAM cell 530 consists of P-type transistors P1, P2 and N-type transistors N4 and N5. When the voltage on node B is high, P-type transistor P1 is off, N-type transistor N4 is on, thereby providing a low voltage on node A. The voltage on node A is supplied to the gates of P-type transistor P2 and N-type transistor N5, thereby turning on P-type transistor P2 and turning off N-type transistor N5, thus insuring that the voltage on node B is high. The high voltage on node B is transmitted to one terminal of pass transistor N6, the gate of which is enabled by a high level enable signal. When transistor N6 is enabled, the high voltage on node B is transmitted to the gate of pass transistor N7, thereby turning on transistor N7 to connect the pad to the conductive track. Note that the gate of transistor N7 can be bootstrapped by the voltage swing on the track segment connected to the source of N-type transistor N7, provided the enable gate N6 is off, thereby to isolate the gate of N7.

In accordance with this invention, there has been described a fully reprogrammable universal interconnect array which provides substantial improvement in flexibility and economy over prior art crosspoint switches. The array of this invention allows the connection of any pins at random, has no fan out limitations, provides bi-directional paths, passive connections and can be implemented in either digital or analog. The invention allows a high pin count (for example 1024 pins). Unlike conventional crosspoint switches, the reprogrammable interconnect component ("RPIC") allows any number of pins to be connected to any pin and is passive and bi-directional so performance varies according to the speed and strength of the driving circuit. The programming data to program the crosspoint switch is retained in memory, typically a conventional SRAM. By serially downloading data from a host system or local processor, the reprogrammable interconnect component of this invention is programmed. The reprogrammable interconnect component of this invention can be used with interfaces where the ability to dynamically reassign interconnect paths is highly useful. These applications include custom control panels, displays, data and voice communications, data acquisition systems, test equipment, test interfaces, parallel processors and systolic arrays. Other applications focus on changing the functionality of a circuit by altering the interconnections of the components in the circuit and the inputs and outputs to the circuit. These applications include systems which emulate mask-programmed application specific integrated circuits (ASICs) by using the universal crosspoint switches of this invention to form the connections between multiple devices such as field programmable gate arrays. The universal crosspoint switches of this invention may also be used to create products where a portion of the circuitry may be customized to the needs of a particular user or class of users.

The universal crosspoint switch of this invention is particularly suitable for implementation in the form of an integrated circuit packaged a pin grid array package or a QFP package. Critical paths may be defined prior to device configuration to provide a lower resistance and capacitance for the resulting circuitry. Incremental changes can then be made in the circuit and connections can be programmed to be either "make-before-break" or "break-before-make". This provides flexibility in communications and other applications where conductive links may optionally be maintained while new connections are being formed or may be broken before new connections are formed.

Other embodiments of this invention will be obvious in view of this disclosure.

What is claimed is:

1. A universal interconnect matrix array comprising:
   a substrate having a plurality of input/output pads situated along a primary surface of said substrate, data being transmissible to and from the interconnect matrix array only through said input/output pads during normal array operation, said input/output pads being arranged in an area matrix of rows and columns such that at least one of said input/output pads is internal to the input/output pads along the periphery of said area matrix and is connectable to external electronic components;
   a first set of conductive leads formed across the primary surface in a first direction;
   a second set of conductive leads formed across the primary surface in a second direction not parallel to said first direction, at least one conductive lead in at least one of said sets of conductive leads being divided into at least two separate conductive segments, selected ones of said conductive leads or segments in both of said sets of conductive leads being connected to at least half of said input/output pads; and
   means for electrically interconnecting selected ones of said conductive leads or segments in said first set of conductive leads to selected ones of said conductive leads or segments in said second set of conductive leads, wherein:
     said first set of conductive leads comprises a first plurality of first groups of conductive leads, each of said first groups of conductive leads being located adjacent to a selected row of said input/output pads; and
     said second set of conductive leads comprises a second plurality of second groups of conductive leads, each of said second groups of conductive leads being located adjacent to a selected column of said input/output pads.

2. A universal interconnect matrix array comprising:
   a substrate having a plurality of input/output pads situated along a primary surface of said substrate, data being transmissible to and from the interconnect matrix array only through said input/output pads during normal array operation, said input/output pads being arranged in an area matrix of rows and columns such that at least one of said input/output pads is internal to the input/output pads along the periphery of said area matrix and is connectable to external electronic components;
   a first set of conductive leads formed across the primary surface in a first direction;
   a second set of conductive leads formed across the primary surface in a second direction not parallel to said first direction, at least one conductive lead in each of said sets of conductive leads being divided into at least two separate conductive segments, selected ones of said conductive leads or segments in both of said sets of conductive leads being connected to at least half of said input/output pads; and means for electrically interconnecting selected ones of said conductive leads or segments in said first set of conductive leads to selected ones of said conductive leads or segments in said second set of conductive leads, wherein:

said first set of conductive leads comprises a first plurality of groups of rows of conductive leads, each of at least two of said groups of rows of conductive leads being located between two adjacent rows of said input/output pads; and said second set of conductive leads comprises a second plurality of groups of columns of conductive leads, each of at least two of said groups of columns of conductive leads being located between two adjacent columns of said input/output pads.

3. Structure as in claim 2, wherein said input/output pads are connected across said substrate predominantly to selected ones of said conductive leads or segments in both of said sets of conductive leads.

4. Structure as in claim 2, wherein said input/output pads are connected across said substrate only to selected ones of said conductive leads or segments in both of said sets of conductive leads.

5. Structure as in claim 2, wherein said means for electrically interconnecting comprises electrically programmable elements.

6. A crosspoint switch formed as an integrated circuit dedicated for programmably interconnecting electronic components external to the integrated circuit, the crosspoint switch comprising:

a substrate having a primary surface;

a plurality of input/output pads situated along the primary surface for connection to said external electronic components, said input/output pads being arranged in an area matrix of rows and columns such that at least one of said input/output pads is internal to the input/output pads along the periphery of said area matrix and is connectable to external electronic components;

a first set of conductive leads formed across the primary surface in a first direction;

a second set of conductive leads formed across the primary surface in a second direction substantially different from the first direction, at least one conductive lead in at least one of said sets of conductive leads being divided into at least two separate conductive segments, selected ones of said conductive leads or segments in both sets of conductive leads being connected to said input/output pads; and means for programmably interconnecting selected ones of said conductive leads or segments in said first set of conductive leads to selected ones of said conductive leads or segments in said second set of conductive leads, wherein:

said first set of conductive leads comprises a first plurality of groups of rows of conductive leads, each of at least two of said groups of rows of conductive leads being located between two adjacent rows of said input/output pads; and said second set of conductive leads comprises a second plurality of groups of columns of conductive leads, each of at least one of said groups of columns of conductive leads being located between two adjacent columns of said input/output pads.

* * * * *